United States Patent [19]

Clatanoff

[11] Patent Number: 4,991,714
[45] Date of Patent: Feb. 12, 1991

[54] SPRING LOADED INTEGRATED CIRCUIT CARRIER

[75] Inventor: William J. Clatanoff, Austin, Tex.

[73] Assignee: Minnesota Mining and Manufacturing Company, St. Paul, Minn.

[21] Appl. No.: 438,694

[22] Filed: Nov. 17, 1989

[51] Int. Cl.⁵ .................................... B65D 73/02
[52] U.S. Cl. .................................... 206/331; 206/328; 206/334
[58] Field of Search ............... 206/331, 328, 334, 560

[56] References Cited

U.S. PATENT DOCUMENTS

| | | | |
|---|---|---|---|
| 3,409,861 | 11/1968 | Barnes et al. | 339/174 |
| 3,652,974 | 3/1972 | Tems | 339/36 |
| 4,379,505 | 4/1983 | Alemanni | 206/329 |
| 4,435,724 | 3/1984 | Ralstin | 357/79 |
| 4,591,053 | 5/1986 | Alemanni | 206/331 |

Primary Examiner—Joseph Man-Fu Moy
Attorney, Agent, or Firm—Donald M. Sell; Walter N. Kirn; John C. Barnes

[57] ABSTRACT

A carrier device, for supporting an electronic component having a plurality of fragile leads extending therefrom, comprising a body having a first and a second surface and having a generally centrally positioned opening, a pair of beams extending into the opening, each with hooks to grasp a component, and a series of interconnected bars joined to the beams to allow flexing of the beams to accept a component between the hooks and for biasing the beams toward each other to contain the component. The body being formed of static dissipative material.

16 Claims, 2 Drawing Sheets

SPRING LOADED INTEGRATED CIRCUIT CARRIER

BACKGROUND OF THE INVENTION

1. Field of the Invention

This invention relates to a carrier for use in handling an integrated circuit component having a plurality of leads extending therefrom and in one aspect to a carrier having a resilient component latching mechanism and having the ability to restrict damage to the component in the event of a discharge of static electricity in its environment.

2. Background of the Invention

The increased number of leads on an integrated circuit device (an IC) and the increased use of automated handling equipment makes it increasingly important to provide carriers for an IC which will be easily opened by an automated piece of equipment and which will securely hold the IC in place on the carrier and free of displacement in the event the carrier is dropped. It is also important that the carrier can be opened and the IC removed for automated placement on a printed circuit board. The increase in the number of leads on an IC and the decrease in the size thereof make the formation of a carrier even more difficult. Also the fact that many an IC has the leads extending from four sides of the square or rectangular format of the IC, makes the carriers more difficult to make. Therefore, in order to provide a carrier which would provide the desired holding force on the IC, afford the easy opening for reception of the IC and the discharge of the IC for placement on a PC board, the geometry had to be optimized. Also, to make the carrier parts of a size that could be molded of a fiber filled polymeric material further compounded the problem, and existing designs of carriers were not suitable.

The prior art is replete with designs of carriers which incorporate spaced fins to separate and protect the leads and many prior art devices have latching mechanisms which afford the automated loading of the carriers. Illustrations of these latching devices for restricting movement of the IC in the carrier, include U.S. Pat. No. 3,409,861, which shows cantilevered beams holding overhanging clips: U.S. Pat. No. 3,652,974 which shows beams attached on two sides with overhanging clips and beam accepting apertures to hold a device in an unstressed state; U.S. Pat. No. 4,379,505 which shows overhanging clips on cantilevered beams; U.S. Pat. No. 4,435,724 discloses overhanging clips on torsion members; and U.S. Pat. No. 4,591,053 describes cantilevered beams with overhanging clips.

These prior art devices utilize an amount of stress on the beams and molded parts which exceeds the stress or elastic deformation that certain members formed thereof can handle when compared to parts formed of unfilled material. Parts formed of a carbon fiber filled composite material or of fibers used to enhance the strength, thermal stability or dimensional stability also detract from the elongation properties of plastics.

Therefore, it is an object of the present invention to provide a carrier which has the desired small parts and which will support the IC against movement in the carrier. It is a further object to provide a carrier which can be molded of a composite material to provide static dissipative characteristics and not have the parts too large to perform the IC holding quality recommended.

SUMMARY OF THE INVENTION

The present invention affords an improved carrier for supporting an electronic component having a plurality of fragile leads extending therefrom. The carrier comprises a unitary body having a first and a second surface and having a generally centrally positioned opening, defined by edge walls, formed in the body and communicating between the first and second surface. Means on the first surface are provided for supporting the leads of an IC component, and means extend into the opening from the edge walls of the opening for supporting an IC within the edge walls. This support means forms a spring loaded latching mechanism and comprises a pair of spaced beams extending outwardly into said opening, one from each of a pair of opposing edge walls, said beams being spaced apart and each beam is formed with IC engaging means for engaging the IC to secure the same within said opening with the leads supported by the means for supporting the leads formed on the first surface of the body. The latching mechanism is provided by flexible bar means extending between said beams and joined thereto for affording the resilient separation of the beams between a first spaced position and a second spaced position for permitting the insertion of an IC between IC engaging means on the beams and for urging the beams toward each other and the normal or first position to afford component retaining means for the body.

A carrier body formed of carbon fiber filled polymeric material will restrict a static charge from being transferred to an IC supported by the carrier.

The latching mechanism comprises bar means including a first bar connected to a first of the pair of beams and extending toward the second beam of the pair of beams supporting the IC engaging means, a second bar connected to the second beam and extending toward the first beam and a third bar connected to the first and second bars. The third bar is joined to the first and second bar at an angle thereto affording a flexing of the bars and connections therebetween and affording a separation of the beams.

BRIEF DESCRIPTION OF THE DRAWING

The present invention will be further described with reference to the accompanying drawing wherein.

DETAILED DESCRIPTION OF THE INVENTION

Figure 1:
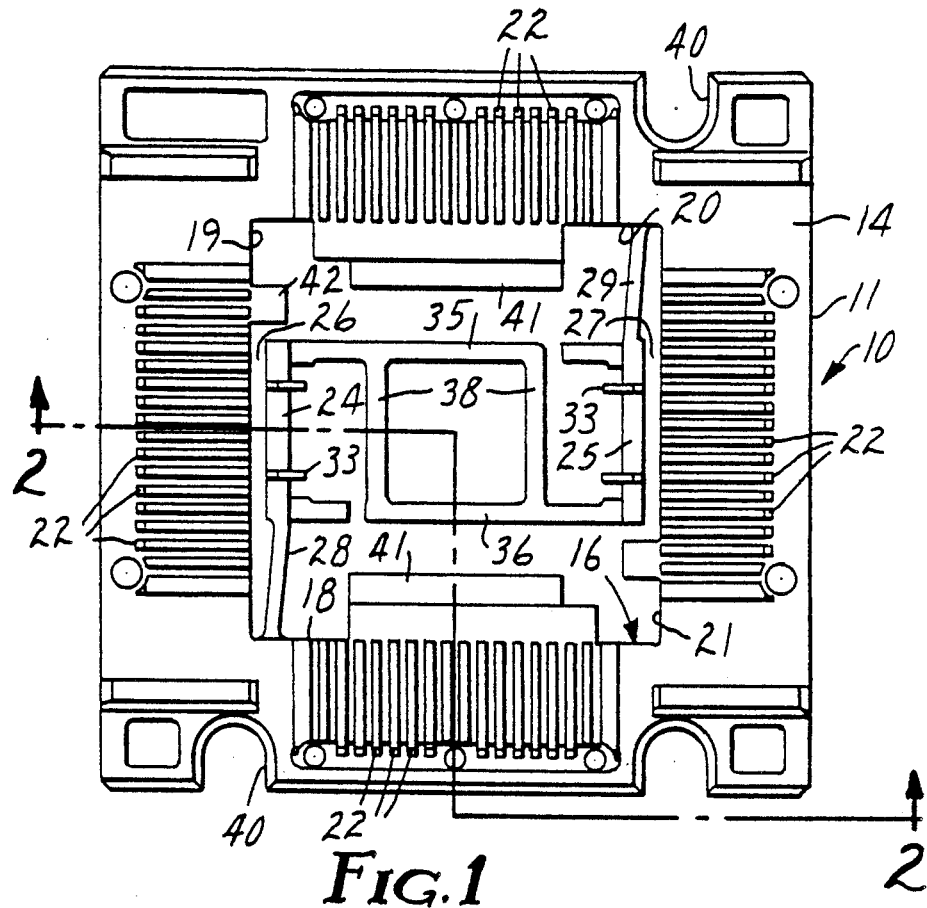
FIG. 1 is a top plan view of a carrier according to the present invention.

The following detailed description of the invention will refer to the drawing wherein like reference numerals refer to like parts throughout the several views.

The present invention provides a carrier for an integrated circuit component (IC) to support the same and protect the tiny leads extending therefrom. The newer IC's are generally square or rectangular in shape and have leads which extend outwardly from all four edge walls. The carrier is consequently, a generally flat rectangularly shaped member with an opening generally centrally thereof for receiving the IC component from one side and for receiving the mechanical fingers which manipulate the latching mechanisms to open the recess for receiving the IC component and for releasing the latching mechanisms to discharge the IC component. In the handling equipment for the carriers the carriers are conveyed to the loading station of the equipment and then a mechanical arm, by a suction equipped carrier, picks up a component and carries it to the loading station. A finger or pawl positioned in the central opening places a force against the rod, beam or bar to bias, pivot, cam or twist the same to move the hooks to an open position to afford entry of the component into the carrier and then release the rod, beam or bar so the hooks close on the component to hold the same in the carrier.

Figure 2:
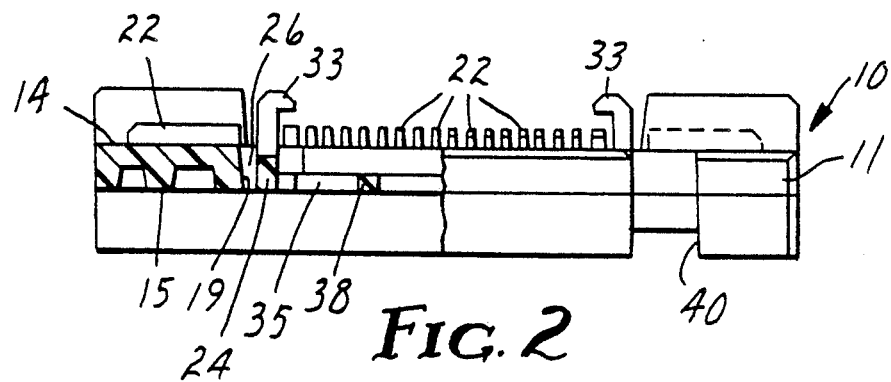
FIG. 2 is a cross sectional view of the carrier of FIG. 1 taken along the line 2—2 of FIG. 1.
Figure 3:
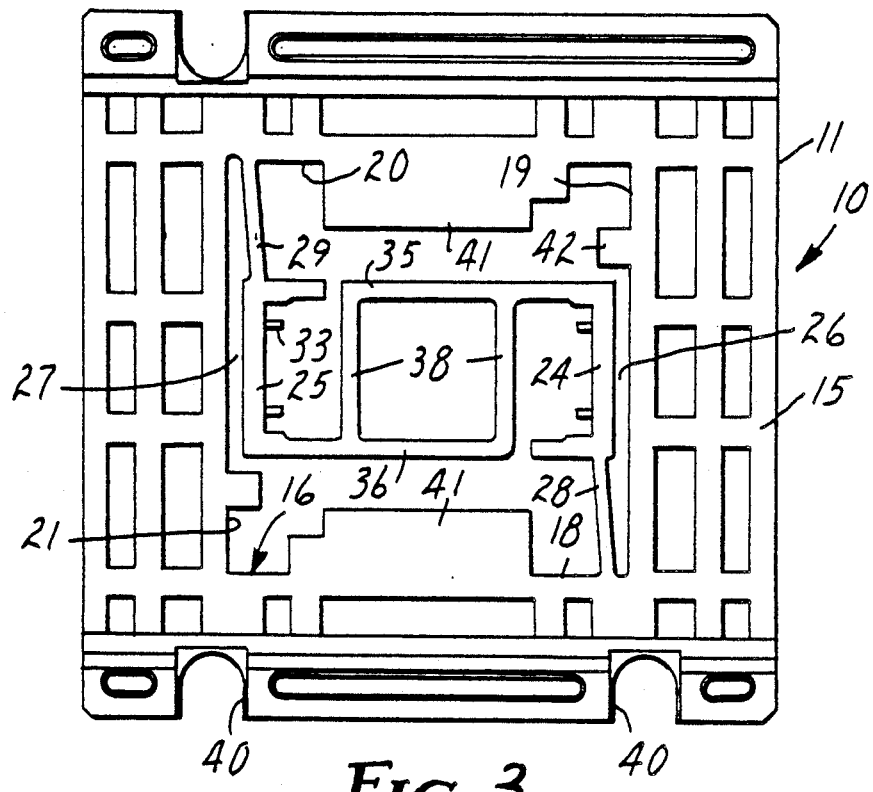
FIG. 3 is a bottom view of the carrier of FIG. 1.

In the carrier of the present invention, referring now to the drawing and FIGS. 1–3, the carrier, generally designated 10, comprises an integrally molded body 11, having a first, top surface 14 and a second, bottom surface 15 and having a generally centrally positioned opening 16, defined by edge walls 18, 19, 20 and 21, formed in said body and communicating between said surfaces 14 and 15. Support means in the form of parallel fins or walls 22, which project from the first surface 14, define a plurality of parallel channels which accommodate the leads extending from an integrated circuit flatpack. The channels are formed between the edge walls 18, 19, 20 and 21 and the peripheral edge on each of the sides of the body 11. The size of the opening 16 is greater than the size of the IC component dimensionally and support means extend into said opening from the edge walls to provide retaining means for securing an IC within the edge walls 18, 19, 20 and 21 of the carrier.

The support means for retaining the IC component within said edge walls comprises a pair of beams 24 and 25 which extend outwardly into said opening 16, one from each of a pair of opposing edge walls 18 and 20, at generally diagonal positions. The beams are thus spaced and extend generally parallel to the edge walls 19 and 21 but are spaced therefrom to define a space 26, 27 respectively between the beam and the adjacent edge wall. The beams 24 and 25 are each provided with a first narrow cantilever mounted portion 28 and 29 respectively and an outer portion of slightly greater dimension which outer portions support, on their upper edge surfaces, component engaging means in the form of a pair of hook-like members 33, spaced apart lengthwise on the beams, including projections at their upper ends which overhang the recess for receiving the IC component. The ends of the hooks 33 are positioned to be located over the IC component or to engage a truncated edge wall to hold the component in the carrier 10.

The beams 24 and 25 are separated to afford entry of the component between the hooks thereon. Spring-like latching means are provided for urging the beams 24 and 25 back toward one another and the hooks into latching engagement against the component. The spring-like latching means includes flexible members defining bar means extending between said beams 24 and 25 and joined thereto for affording the resilient separation of said beams between a first spaced position and a second spaced position, with the beams displaced into the spaces 26 and 27, for permitting the insertion of a component between the hooks 33 on one beam and the hooks 33 on the other beam. The bar means comprises a first bar 35 connected to beam 24, which bar 35 extends toward the second beam 25 of the pair of beams and a second bar 36 is connected to the second beam 25 and extends toward the first beam 24. A third bar 38 is connected to the first bar 35 and to the second bar 36. The third bar 38 is joined to the first and second bar at an angle thereto affording a flexing of the bars and a flexing of the connecting bends or corners between the beams to permit separation of the beams sufficiently to afford insertion of the component therebetween and afford a low level of stress on the beams and junctions between the beams and bars and between the bars. In the embodiment of FIGS. 1–3 there are two bars 38 forming a parallelogram with the bars 35 and 36. This structure increases the areas for flexure and the resilience of the material of the bars return them to the normal spaced position, before separation, to retain the component in the fixed position.

As shown in FIG. 3, the carrier 10 is formed with carrier locating notches or openings 40 in the peripheral side walls, a series of recesses in the bottom surface 15 to reduce the amount of material used in molding the carrier, and several added symmetrical projections 41 and 42 extending into the opening 16 from the side walls 18, 20 and 19, 21 respectively. The projections 41 form platforms for the component as it is placed in the carrier to register the position of the component between the surfaces 14 and 15. The notches 41 then register the component with respect to a test device of component handling member.

Figure 5:
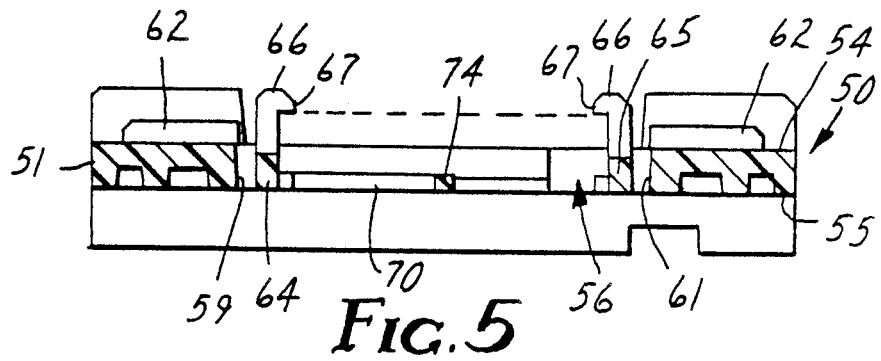
FIG. 5 is a cross-sectional view taken approximately along the line 5—5 of FIG. 4.
Figure 4:
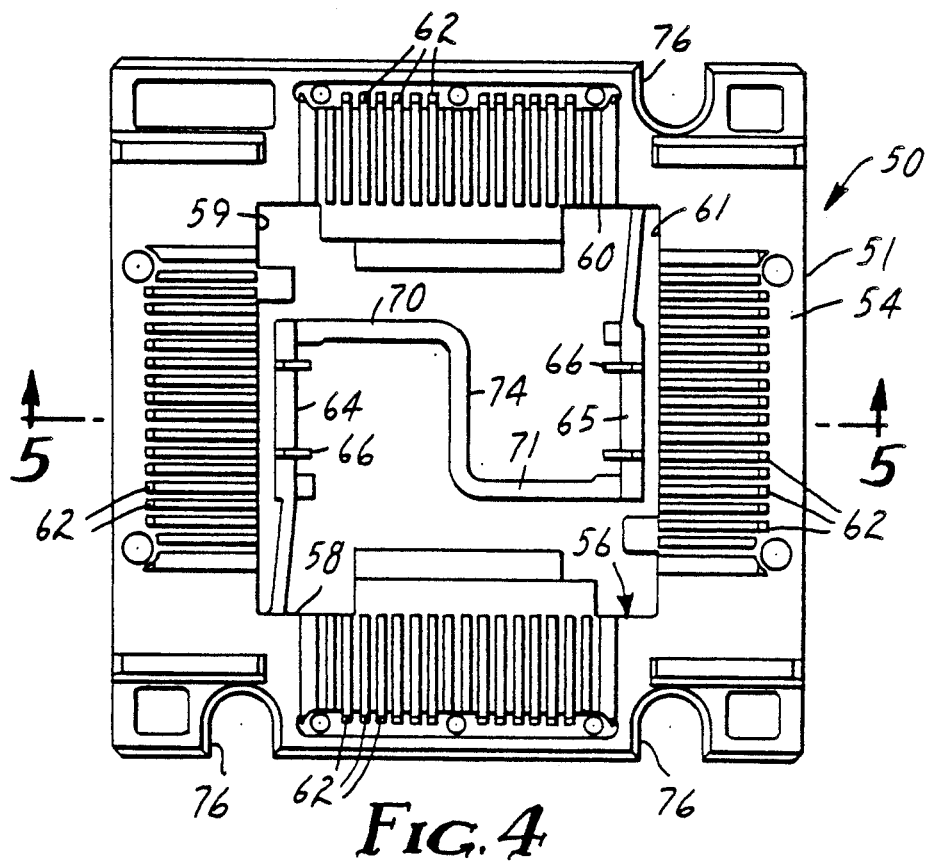
FIG. 4 is a top plan view of a second embodiment of a carrier formed according to the present invention.

In the embodiment shown in FIGS. 4 and 5, the carrier 50 comprises an integrally molded body 51, having a first, top surface 54 and a second, bottom surface 55 and having a generally centrally positioned opening 56, defined by edge walls 58, 59, 60 and 61, formed in said body and communicating between the surfaces 54 and 55. Support means in the form of parallel fins or walls 62, which project from the first surface 54, define a plurality of parallel channels which accommodate the leads extending from an integrated circuit flatpack. The size of the opening 56 is greater than the size of the IC component dimensionally and support means extending into said opening from the edge walls provide retaining means for securing an IC within the edge walls 58, 59, 60 and 61 of the carrier.

The support means for retaining the IC component within said edge walls comprises a pair of beams 64 and 65 which extend outwardly into said opening 56, one from each of a pair of opposing edge walls 58 and 60, at generally diagonal positions similar to the bars 24 and 25 of the earlier embodiment. The beams 64 and 65 extend in generally parallel spaced relationship to the edge walls 59 and 61. The beams 64 and 65 are each formed similar to the beams 24 and 25, and on their upper edge surfaces, component engaging means in the form of a pair of hook-like members 66 spaced apart lengthwise on the beams, including projections 67 at their upper ends which overhang the recess for receiving the IC component. The ends of the hooks 66 are positioned to be located over the IC component or to engage a truncated edge wall to hold the component in the carrier 50.

The beams 64 and 65 are separated to afford entry of the component between the hooks thereon. Spring-like latching means are provided between the beams for urging the beams 64 and 65 back toward one another and the hooks into latching engagement against the component. The spring-like latching means include a pair of bars 70, 71 extending between said beams 64 and 65 and joined thereto for affording the resilient separation of said beams 64 and 65 between a first spaced position and a second spaced position for permitting the insertion of a component between the hooks 66 on one beam and the hooks 66 on the other beam. A third bar 74 is connected to the first bar 70 and to the second bar 71 defining a generally S-shaped flexible connection. The third bar 74 is joined to the first and second bar at an angle thereto affording a flexing of the bars and a flexing of the bends or corners between the beams. The flexing of the bars permit separation of the beams sufficiently to permit insertion of the component therebetween and afford a low level of stress on the beams and junctions between the beams and bars and between the bars.

Notches 76 are formed in the peripheral side walls of the carrier to register the component with respect to a test device of component handling member or loading and unloading equipment.

The bodies of the carriers 10 and 50 can be formed of fiber filled polymeric materials to make the body static dissipative to restrict a static charge from being transferred to an IC component supported by the body. Examples of such materials include conductive additive filled material such as conductive particles or fibers. An example of the material used is a carbon fiber filled polysulfone. Alternatively, the body may be formed of a reinforcing fiber filled polymeric material to increase the strength, thermal or dimensional stability of the polymeric material.

Having described the present invention with relationship to the accompanying drawing illustrating the preferred embodiment of the same, it is to be understood that changes in the configuration of parts or their relationship may be made without departing from the spirit or scope of the present invention as defined by the appended claims.

What is claimed is:

1. A carrier device for supporting an electronic component having a plurality of fragile leads extending therefrom, said carrier comprising a unitary body having a first and a second surface and having a generally centrally positioned opening, defined by edge walls, formed in said body and communicating between said surfaces, means on said first surface for supporting the leads of a said component and means extending into said opening from the edge walls defining said opening for supporting a said component within said edge walls, said support means comprising a pair of beams extending outwardly into said opening, one from each of a pair of opposing edge walls, said beams being spaced apart and each beam being formed with component engaging means for engaging the component to secure the same within said opening with the leads supported by said means for supporting said leads, and flexible means extending between said beams and joined thereto for affording the resilient separation of said beams between a first spaced position and a second spaced position for permitting the insertion of a said component between said component engaging means on said beams and for urging said beams toward each other and said first position to afford component retaining means for said body.

2. A carrier according to claim 1 wherein said body is formed of a filled polymeric material.

3. A carrier according to claim 1 wherein said flexible means comprises a first bar connected to a first of said pair of beams and extending toward the second beam of said pair of beams, a second bar connected to said second beam and extending toward said first beam and a third bar connected to said first and second bars, said third bar being joined to said first and second bar at an angle thereto affording a flexing of said flexible means and separation of said beams.

4. A carrier according to claim 3 wherein said third bar of said flexible means comprises a plurality of bars forming a parallelogram.

5. A carrier according to claim 3 wherein said first and second bar are connected to said beams adjacent the free ends thereof.

6. A carrier according to claim 4 wherein said first and second bar are connected to said first and second beam, respectively adjacent the free ends thereof.

7. A carrier according to claim 3 wherein said bars are formed integrally with said beams and said body.

8. A carrier according to claim 1 wherein said means engaging said component comprise hook means formed integrally with said beams and projecting therefrom in the direction of said first surface.

9. A carrier according to claim 8 wherein said hook means comprises a pair of hook members supported in spaced relationship along each beam generally symmetrically with said opening.

10. A carrier according to claim 1 wherein said body is formed of a filled polymeric material having a conductivity sufficient to dissipate static charges for protecting a said component.

11. A carrier according to claim 7 wherein said body is formed of a filled polymeric material.

12. A carrier according to claim 11 wherein said fill material is conductive to make the carrier static dissipative.

13. A carrier according to claim 11 wherein said fill material comprises fibers to enhance the strength of the body.

14. A carrier according to claim 11 wherein said fill material comprises conductive fibers to make the body conductive.

15. A carrier device for supporting an electronic component having a plurality of fragile leads extending therefrom, said carrier comprising a unitary body having a first and a second surface and having a generally centrally positioned opening, defined by edge walls, formed in said body and communicating between said surfaces, means on said first surface for supporting the leads of a said component and means extending into said opening from the edge walls defining said opening for supporting a said component within said edge walls, said support means comprising a pair of beams extending outwardly into said opening from said edge walls, said beams being spaced apart and said beams being formed with component engaging means for engaging opposite sides of a said component to secure the same within said opening with the leads supported by said means for supporting said leads, and flexible bar means extending between said beams and joined thereto for affording the resilient separation of said beams between a first spaced position and a second spaced position for permitting the insertion of a said component between said component engaging means on said beams and for urging said beams toward each other and said first position to afford component retaining means for said body.

16. A carrier device for supporting an electronic component having a plurality of fragile leads extending therefrom, said carrier comprising
a unitary body having a first and a second surface and having a generally centrally positioned opening, defined by edge walls, formed in said body and communicating between said surfaces, means on said first surface for supporting the leads of a said component and means extending into said opening from the edge walls defining said opening for supporting a said component within said edge walls, said support means comprising a pair of beams extending outwardly into said opening from said edge walls, said beams being spaced apart and each being spaced from and extending generally parallel to an adjacent edge wall, and said beams being formed with component engaging means for engaging opposite sides of a said component to secure the same within said opening with the leads supported by said means for supporting said leads, and flexible bar means extending between said beams and joined thereto for connecting said beams and for affording the resilient separation of said beams between a first spaced position and a second spaced position for permitting the insertion of a said component between said component engaging means on said beams and for urging said beams toward each other and said first position to afford component retaining means for said body, said bar means including a first bar connected to a first of said pair of beams and extending toward the second beam of said pair of beams, a second bar connected to said second beam and extending toward said first beam, and a third and fourth bar extending in parallel spaced relationship to each other and each being joined to said first and second bars at an angle thereto, whereby the beams are joined to each other but said bars afford resilient separation of said beams.

* * * * *